United States Patent [19]

Yoshida

[11] Patent Number: 5,110,750
[45] Date of Patent: May 5, 1992

[54] SEMICONDUCTOR DEVICE AND METHOD OF MAKING THE SAME

[75] Inventor: Munehiro Yoshida, Yokohama, Japan

[73] Assignee: Kabushiki Kaisha Toshiba, Kanagawa, Japan

[21] Appl. No.: 561,608

[22] Filed: Aug. 2, 1990

[30] Foreign Application Priority Data

Aug. 8, 1989 [JP] Japan .................. 1-203771

[51] Int. Cl.⁵ .......................... H01L 21/266
[52] U.S. Cl. ........................ 437/27; 437/30; 437/56; 437/154; 437/958
[58] Field of Search .............. 437/30, 154, 958, 27, 437/56; 148/DIG. 145, DIG. 157; 357/90

[56] References Cited

U.S. PATENT DOCUMENTS 3,719,535 3/1973 Zoroglu .................. 437/154
4,728,619 3/1988 Pfiester .................. 437/56

FOREIGN PATENT DOCUMENTS 0144248 7/1984 European Pat. Off. .
0189208 1/1986 European Pat. Off. .
0017655 2/1983 Japan ..................... 437/56
0084016 4/1986 Japan ..................... 437/27

OTHER PUBLICATIONS

European Search Report, Kabushiki Kaisha Toshiba, Appln. No. 90115161.3, 3 pp., dated Jan. 1, 1991.

Primary Examiner—Olik Chaudhuri
Assistant Examiner—Ourmazo S. Ojan
Attorney, Agent, or Firm—Banner, Birch, McKie & Beckett

[57] ABSTRACT

For compensating a decreased impurity concentration at a peripheral portion of a well region provided in a semiconductor substrate, an impurity whose conductivity type is same as that of the well region is diffused into the peripheral portion thereof to form a diffused region thereon. Therefore, the well region having the approximately uniform surface impurity concentration is provided.

12 Claims, 8 Drawing Sheets

SEMICONDUCTOR DEVICE AND METHOD OF MAKING THE SAME

BACKGROUND OF THE INVENTION

1. Field of the Invention

The present invention relates to a semiconductor device and a method of making the same, and more particularly to a semiconductor device which includes at least one well region having a substantially uniform surface impurity concentration, and a method of making the same.

2. Description of the Related Art

Referring to FIGS. 9 and 10, a well region of a conventional semiconductor device will be described.

As shown in FIG. 9, a semiconductor device such as conventional MOS type field effect transistors (MOSFETs) includes, for example, N-type semiconductor substrate 30, and P-type well region 31 provided in the substrate.

The P-type well region 31 is formed by ion-implantation of P-type impurity into the N-type semi-conductor substrate 30, followed by a thermal diffusion process. However, the well region thus formed exceeds a point b, which is a boundary of the impurity region introduced by the ion implantation, and reaches a point c, as shown in FIG. 9. As a result, the impurity concentration of the substrate surface (hereinafter called surface concentration) may be reduced at the boundary portion between the P-type well region 31 and the N-type semiconductor substrate 30 due to the impurity diffusion.

FIG. 10 is an impurity concentration profile in a surface direction of the semiconductor device. As illustrated in the drawing, the surface concentration of the P-type well region 31 is substantially uniform in a region defined between the center of the well region and the point a, but decreases in a region beyond the point a. Consequently, if a MOSFET is formed in the region between points a and c, the threshold voltage may be changed—for example, may be reduced to an undesired value. For this purpose, forming the MOSFET in the region between points a and c where the surface concentration is reduced is avoided, and the MOSFET is provided in a region of the p-type well region 31 inside the point a, thereby preventing the change in the threshold voltage.

In other words, the change in the threshold voltage is prevented by locating the MOSFET in the region having uniform surface concentration.

However, if it is intended to increase the impurity concentration of the P-type well region, or it is intended to increase the depth of the well region, the distance between point a and c where the surface concentration is reduced will be increased. Consequently, the region in which the MOSFET cannot be formed will be enlarged. This is a serious problem for semiconductor integrated circuits for requiring high integration density.

SUMMARY OF THE INVENTION

Therefore, it is an object of the present invention to provide a semiconductor device which includes at least one well region having a substantially uniform surface concentration.

It is another object of the present invention to provide a method of making such a semiconductor device.

According to one of the aspects of the present invention, a semiconductor device comprises at least one well region of opposite conductivity type provided in a semiconductor substrate of one conductivity type, and a diffused region of opposite conductivity type which is provided at the peripheral portion of the well region and which compensates for a decreased surface concentration at the peripheral portion. Thus, the well region having the substantially uniform surface concentration will be provided.

According to another aspect of the present invention, there is provided a method of making the semiconductor device based on a principle incorporated with the firstly referred aspect of the present invention.

BRIEF DESCRIPTION OF THE DRAWINGS

The novel and distinctive features of the invention are set forth in the claims appended to the present application. The invention itself, however, together with further objects and advantages thereof, may best be understood by reference to the following description and accompanying drawings, in which:

DETAILED DESCRIPTION OF THE PREFERRED EMBODIMENTS

Referring to FIGS. 1 to 8, a semiconductor device and a method of making the same according to the embodiments of the present invention will be described.

Figure 1:
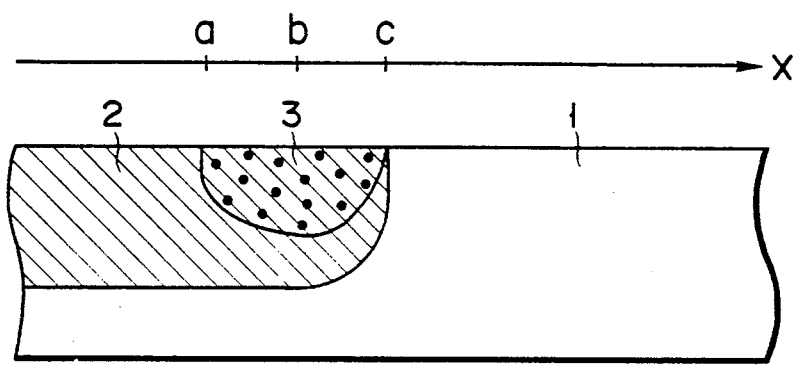
FIG. 1 is a cross-sectional view of a semiconductor device having a well region according to a first embodiment of the present invention.

FIG. 1 is a cross-sectional view of a semiconductor device having a well region according to a first embodiment of the present invention.

In the semiconductor device of the embodiment, P-type well region 2 is provided in an N-type semiconductor substrate by impurity diffusion techniques, and P-type diffused region 3 for impurity compensation is formed at a portion of P-type well region 2 adjacent to N-type semiconductor substrate 1, which corresponds to the peripheral portion of the P-type well region 2 where the surface concentration is lower than that of the central portion.

In other words, the P-type diffused compensation region 3 is formed in a portion of P-type well region 2 adjacent to N-type semiconductor substrate 1, specifically the surface region defined between points a and c in the drawing, where the surface concentration is low. Consequently, the overall surface concentration between points a and c becomes the sum of the surface concentrations of P-type well region 2 and P-type diffused compensation region 3. In this case, the diffusing conditions for the P-type diffused compensation region 3, such as the depth, the concentration, the width, etc., are set so as to compensate for the decreased surface concentration of the P-type well region 2. Accordingly, the region of P-type well region 2 is compensated for its decreased surface concentration, and the region with the uniform surface concentration is expanded. Therefore, the well region can be effectively utilized.

Figure 2:
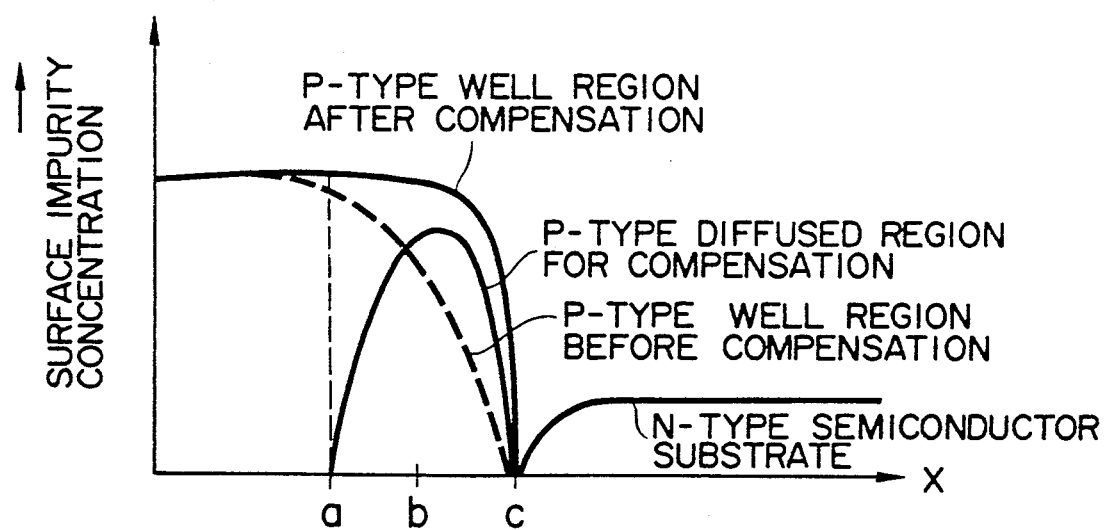
FIG. 2 is an impurity concentration profile in a surface direction of the semiconductor device shown in FIG. 1.

FIG. 2 is an impurity concentration profile in a surface direction of the semiconductor device shown in FIG. 1.

As is evident from FIG. 2, the surface concentration of P-type diffused region 2 is compensated so as to become uniform. In fact, the uniform concentration region is made wider in the case of the P-type diffused region after the compensation illustrated by the continuous line than in the case of that before the compensation illustrated by the dotted line.

FIGS. 3A to 3E are cross-sectional views showing a process for making a semiconductor device according to a second embodiment of the present invention.

Figure 3A:
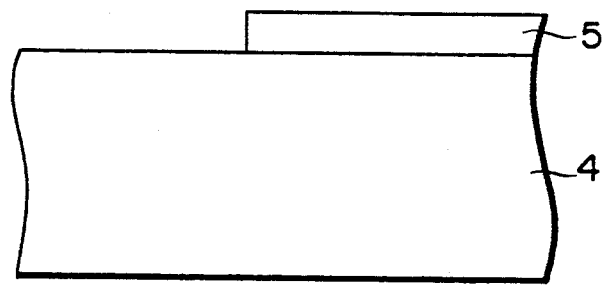
FIGS. 3A to 3E are cross-sectional views showing a process for making a semiconductor device according to a second embodiment of the invention.

First, a resist pattern 5, which is selectively patterned, is formed on an N-type semiconductor substrate 4 by lithography techniques (FIG. 3A).

Figure 3B:
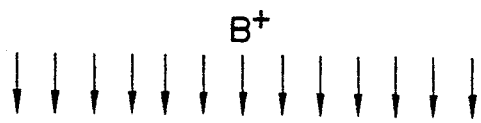
Figure 3B:
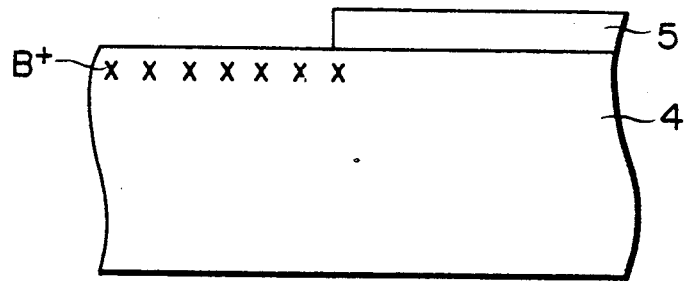

Then, boron ions are implanted into the substrate at an acceleration voltage of 150 KeV and a dose of $2.5 \times 10^{13}/cm^2$, using the resist pattern 5 as a mask (FIG. 3B).

Figure 3C:
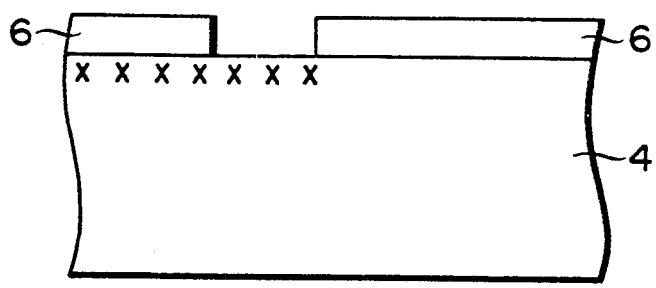

After the resist pattern 5 is removed, a resist pattern 6, selectively patterned, is formed on the substrate surface (FIG. 3C).

Figure 3D:
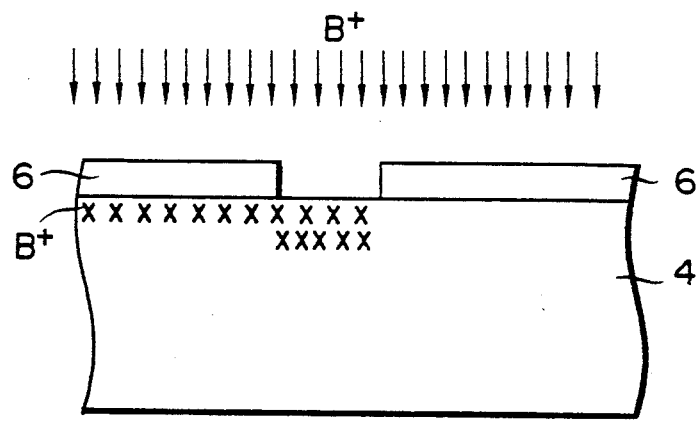

Boron ions are implanted into the substrate at an acceleration voltage of 150 KeV and a dose of $7.5 \times 10^{13}/cm^2$, using the resist pattern 6 as a mask (FIG. 3D).

Figure 3E:
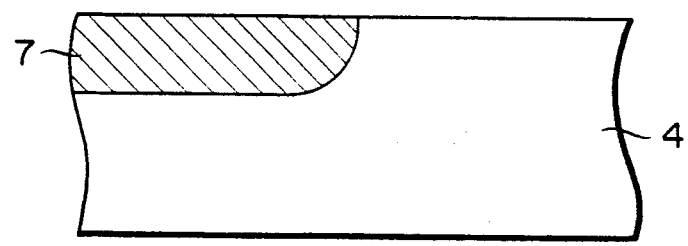

Thereafter, the resist pattern 6 is removed, and the substrate twice implanted with boron ions is heat-treated at 1190° C. for 280 min. to provide a P-type well region 7 therein (FIG. 3E).

According to such a method of making the semiconductor device, boron ions are implanted twice to the portion of P-type well region 7 adjacent to N-type semiconductor substrate 4. Therefore, with the appropriate dose and acceleration voltage, the surface concentration of this adjacent portion is not lowered and it can be made substantially equivalent to that of the central portion.

Figure 4:
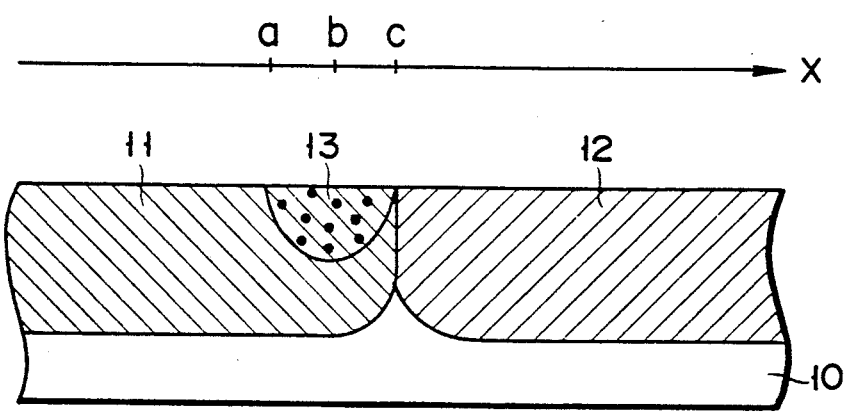
FIG. 4 is a cross-sectional view of a semiconductor device having well regions according to a third embodiment of the present invention.

FIG. 4 is a cross-sectional view of a semiconductor device according to a third embodiment of the present invention.

In the semiconductor device of the embodiment, P- and N-type well regions 11 and 12 are provided in an N-type semiconductor substrate 10. Further, P-type diffused compensation region 13 is formed at a portion of the P-type well region 11 adjacent to the N-type well region 12, i.e., the peripheral portion of P-type well region 11 where the surface concentration thereof is lower than that of the central portion.

Meanwhile, in the case where a well region is formed in a semiconductor substrate by thermal diffusion techniques, a surface concentration of a P-type diffused region is lowered due to a silicon oxide film of the substrate surface when an impurity is of P-type conductivity: Whereas a surface concentration of an N-type diffused region is not decreased but rather tends to increase, and the surface concentration at the peripheral portion of the N-type diffused region is not reduced when the impurity is of N-type conductivity. Therefore, an N-type diffused region for impurity compensation may not be required for the N-type well region.

Further, the impurity concentration of the N-type well region 12 in the embodiment is higher than that of the N-type semiconductor substrate 1 in the first embodiment, and this N-type well region 12 is adjacent to the P-type well region 11. Therefore, the distribution of the surface concentration of the P-type well region 11 is considerably affected by the diffusing conditions such as the diffusion time, the treatment for the substrate surface during the diffusion, etc. In this case, a more satisfactory advantage can be obtained by providing the P-type diffused compensation region 13 to the P-type well region 11.

Figure 5:
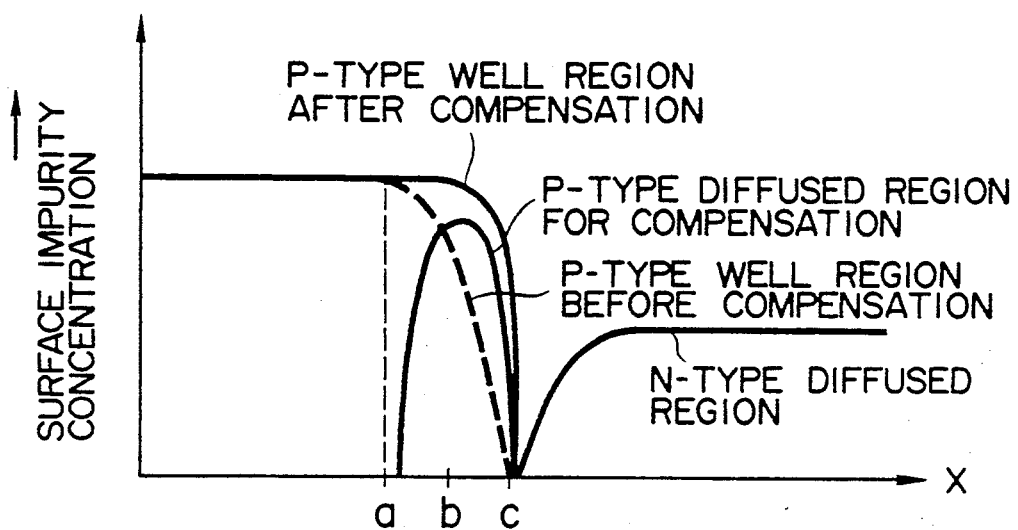
FIG. 5 is an impurity concentration profile in a surface direction of the semiconductor device shown in FIG. 4.

FIG. 5 is a surface concentration profile in a surface direction of the semiconductor device shown in FIG. 4. It will be apparent from the drawing that an advantage similar to that of the first embodiment is obtained.

Figure 6:
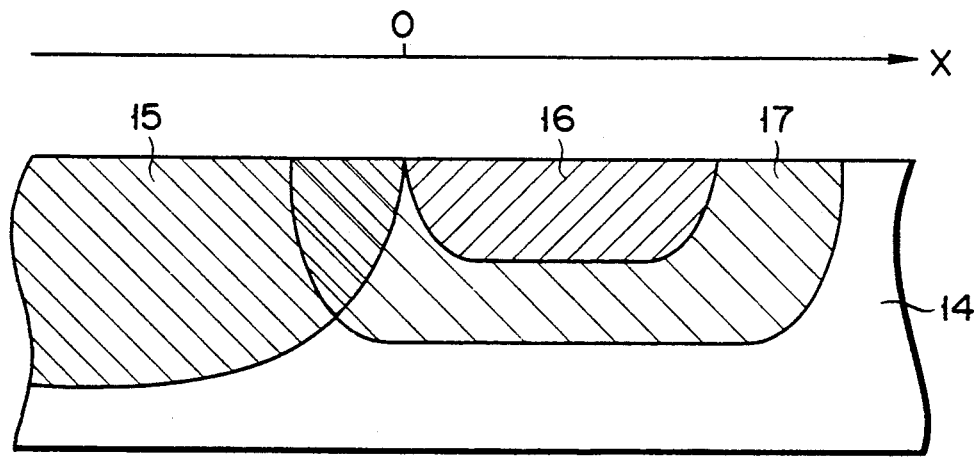
FIG. 6 is a cross-sectional view of a semiconductor device having well regions according to a fourth embodiment of the present invention.

FIG. 6 is a cross-sectional view of a semiconductor device according to a fourth embodiment of the present invention.

In the semiconductor device of the embodiment, P- and N-type well regions 15 and 16, respectively, are adjacently provided in an N-type semiconductor substrate 14 by impurity diffusion techniques. Further, a P-type diffused isolation region 17 is provided in the N-type semiconductor substrate 14. The N-type well region 16 is formed in the P-type isolation region 17.

According to the semiconductor device, since a part of the P-type isolation region 17 is overlapped with the peripheral portion of the P-type well region 15 where the surface concentration is lower than the center portion, an advantage similar to that of the third embodiment can be obtained.

Figure 7:
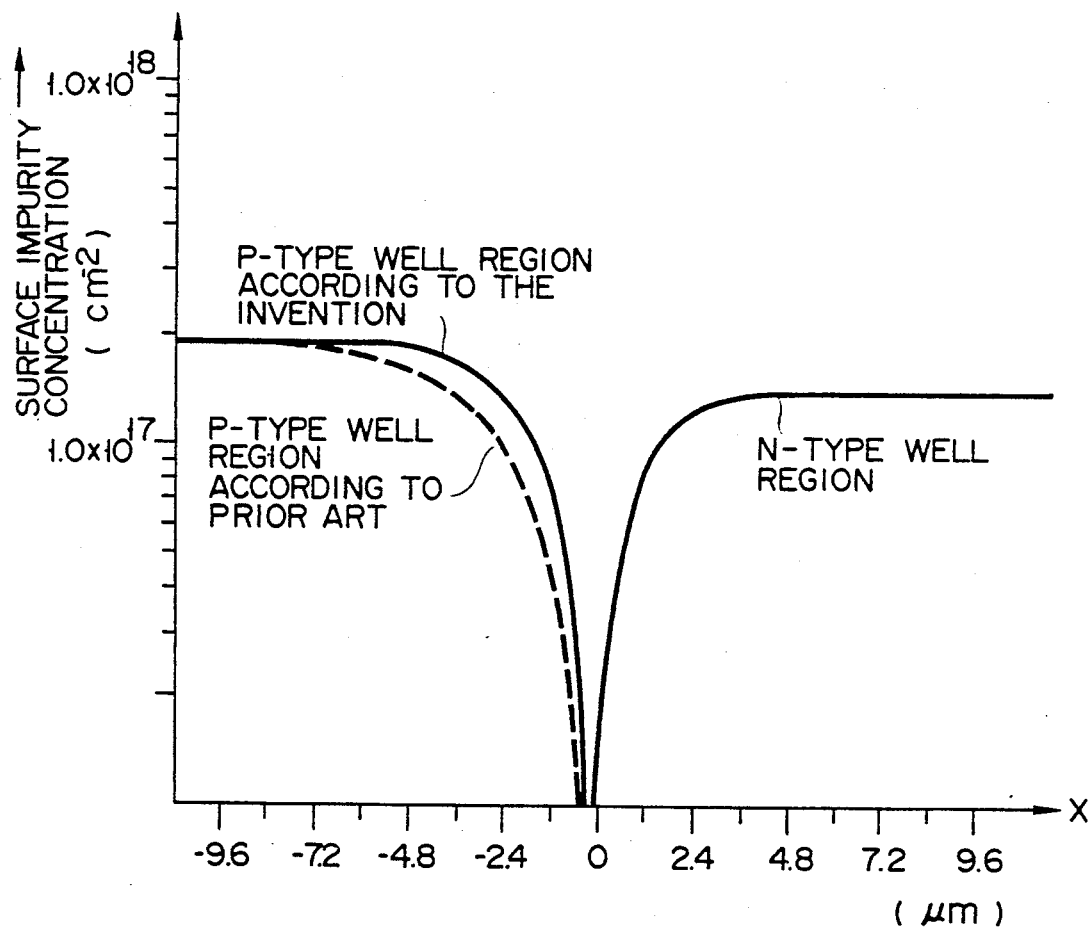
FIG. 7 is an impurity concentration profile in a surface direction of the semiconductor device shown in FIG. 6.

FIG. 7 is a surface concentration profile in a surface direction of the semiconductor device shown in FIG. 6. It will be apparent from the drawing that the region with the uniform surface concentration is increased by approximately 2.6 $\mu$m in the case of the present invention indicated by the continuous line as compared with the case of the conventional technique indicated by the dotted line.

FIGS. 8A to 8G are cross-sectional views showing a process for making a semiconductor device according to a fifth embodiment of the present invention.

Figure 8A:
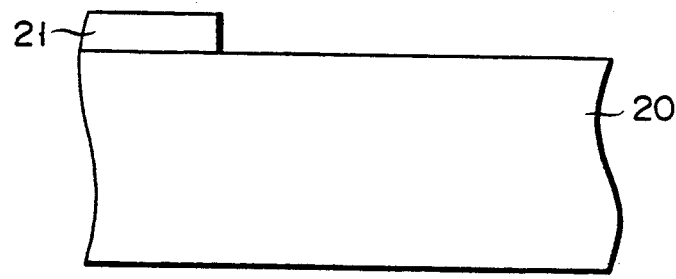
FIGS. 8A to 8G are cross-sectional views showing a process for making the semiconductor device according to a fifth embodiment of the invention.

First, a resist pattern 21, which is selectively patterned, is formed on an N-type semiconductor substrate 20 by lithography techniques (FIG. 8A).

Figure 8B:
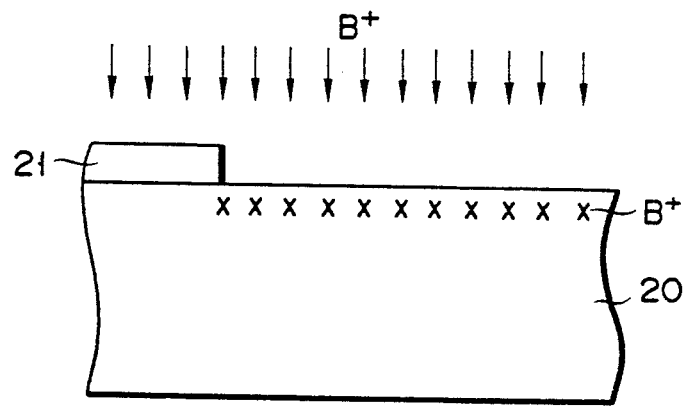

Then, boron ions are implanted into the sutstrate at an acceleration voltage of 150 KeV and a dose of $2.5 \times 10^{13}/cm^2$, using the resist pattern 21 as a mask (FIG. 8B).

Figure 8C:
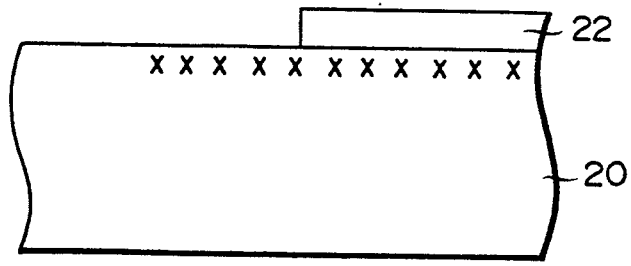

After the resist pattern 21 is removed, a resist pattern 22, selectively patterned, is formed on the substrate surface (FIG. 8C).

Figure 8D:
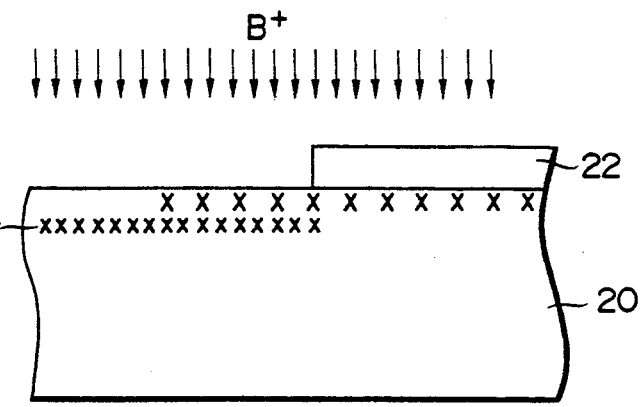

Boron ions are implanted into the substrate at an acceleration voltage of 150 KeV and a dose of $7.5 \times 10^{13}/cm^2$, using the resist pattern 22 as a mask (FIG. 8D).

Figure 8E:
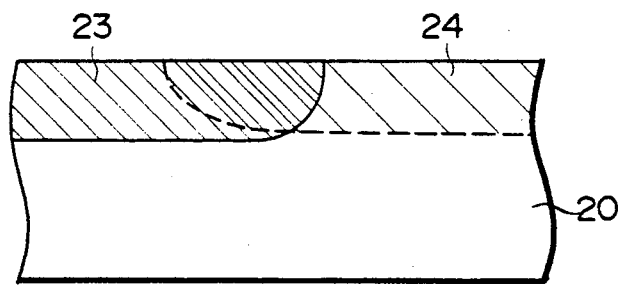

Thereafter, the resist pattern 22 is removed, and the substrate twice implanted with boron ions is heat-treated at 1190° C. for 280 min. to provide a P-type well region 23 and a P-type diffused isolation region 24 therein (FIG. 8E).

Figure 8F:
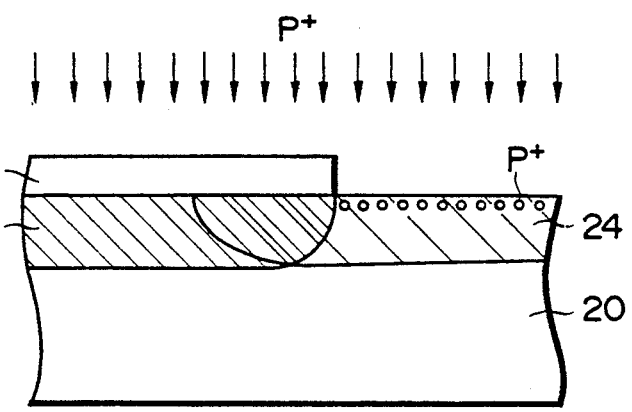

Next, a resist pattern 25, selectively patterned, is formed on the N type semiconductor substrate 20, and phosphorus ions are implanted at an acceleration voltage of 150 KeV and a dose of $7.5 \times 10^{13}/cm^2$, using the resist pattern 25 as a mask (FIG. 8F).

Figure 8G:
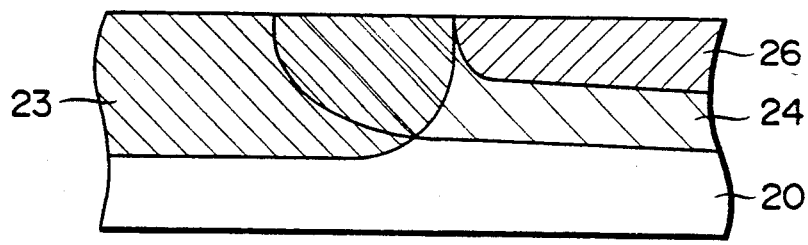
Figure 9:
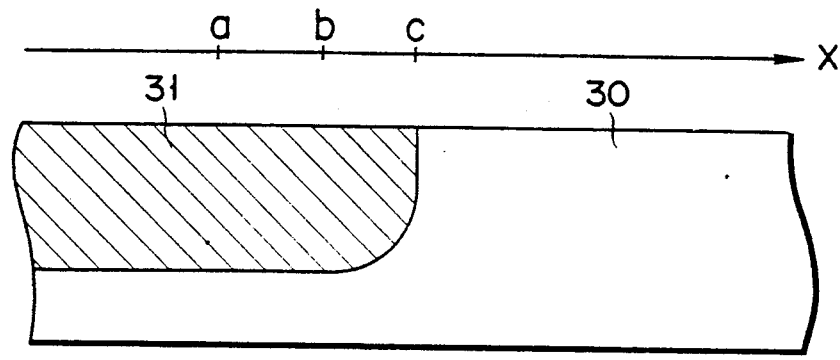
FIG. 9 is a cross-sectional view of a conventional semiconductor device having a well region.
Figure 10:
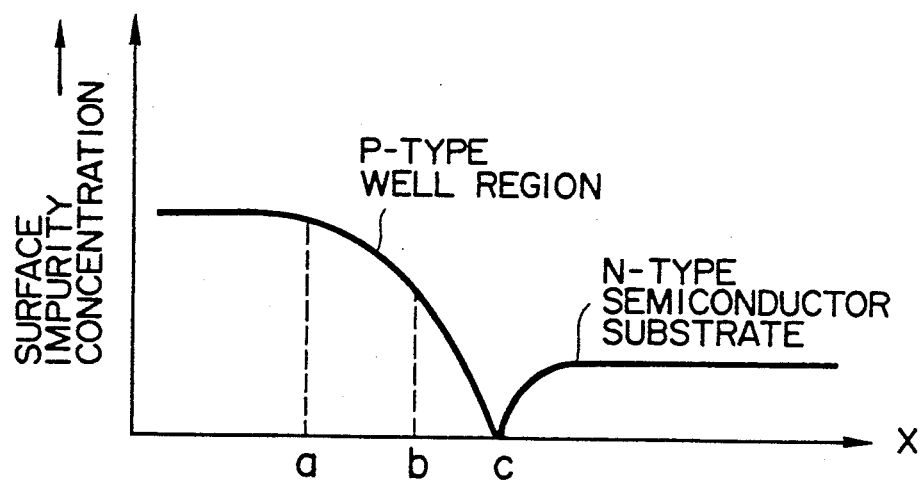
FIG. 10 is an impurity concentration profile in a surface direction of the semiconductor device shown in FIG. 9.

Thereafter, the resist pattern 25 is removed, and the substrate is heat-treated at 1190° C. for 280 min. to provide an N-type diffused region 26 therein (FIG. 8G).

According to the method of making the semiconductor device, the P-type isolation region 24 is simultaneously formed at the peripheral portion of the P-type well region 23. Therefore, an advantage similar to that of the second embodiment can be obtained without increasing manufacturing steps of the conventional technique.

It is further understood by those skilled in the art that the foregoing description contains preferred embodiments of the disclosed device and that various changes and modifications may be made in the invention without departing from the spirit and scope thereof.

What is claimed is:

1. A method of increasing a concentration of an impurity at the periphery of a well region in a semiconductor device comprising the steps of:
    preparing a semiconductor substrate of a first conductivity type;
    selectively introducing an impurity of a second conductivity type into said semiconductor substrate to provide at least one first well region of the second conductivity type therein, the second conductivity type being opposite from the first conductivity type; and
    selectively introducing an impurity of the second conductivity type into a peripheral portion of said at least one first well region where the impurity concentration is less than the impurity concentration at the center of the at least one first well region, thereby increasing the impurity concentration of the second conductivity type at said peripheral portion of the at least one first well region to obtain a uniform surface impurity concentration between the peripheral portion and the center of said at least one first well region.

2. The method of making a semiconductor device according to claim 1, wherein said at least one first well region is formed by impurity diffusion techniques.

3. The method of making a semiconductor device according to claim 1, wherein said at least one first well region is formed by ion implantation techniques.

4. The method of making a semiconductor device according to claim 1, wherein the step of selectively introducing an impurity of the second conductivity type into the peripheral portion of said at least one first well region is performed by impurity diffusion techniques.

5. The method of making a semiconductor device according to claim 1, wherein the step of selectively introducing an impurity of the second conductivity type into the peripheral portion of said at least one first well region is performed by ion implantation techniques.

6. The method of making a semiconductor device according to claim 1, wherein at least one second well region of the first conductivity type is formed in said semiconductor substrate bordering said at least one first well region of the second conductivity type.

7. The method of making a semiconductor device according to claim 1, wherein at least one semiconductor circuit element is provided in said at least one first well region.

8. The method of making a semiconductor device according to claim 1, wherein at least one semiconductor circuit element is provided in at least one second well region.

9. A method of making a semiconductor device comprising the steps of:
    preparing a semiconductor substrate of a first conductivity type;
    selectively introducing an impurity of a second conductivity type into said semiconductor substrate to provide at least one first well region of the second conductivity type therein, the second conductivity type being opposite from the first conductivity type;
    selectively introducing an impurity of the second conductivity type into said semiconductor substrate to form at least one isolation region of the second conductivity type therein which overlaps a peripheral portion of said at least one first well region so that an impurity concentration at the peripheral portion of the at least one first well region is increased by the impurity concentration of the at least one isolation region, providing a uniform surface impurity concentration between the peripheral portion and the center of said at least one first well region; and
    selectively introducing an impurity of the first conductivity type into said at least one isolation region to provide at least one second well region of the first conductivity type therein.

10. The method of making a semiconductor device according to claim 9, wherein said at least one first well region, said at least one isolation region and said at least one second well region are formed by ion implantation techniques.

11. The method of making a semiconductor device according to claim 9, wherein at least one semiconductor circuit element is provided in said at least one first well region.

12. The method of making a semiconductor device according to claim 9, wherein at least one semiconductor circuit element is provide in said at least one second well region.

* * * * *